(12) United States Patent
Beitman, Sr.

(10) Patent No.: US 9,653,632 B1
(45) Date of Patent: May 16, 2017

(54) SOLAR POWER SYSTEM AND RELATED METHODS

(71) Applicant: Richard Clark Howell Beitman, Sr., Gilbert, AZ (US)

(72) Inventor: Richard Clark Howell Beitman, Sr., Gilbert, AZ (US)

( * ) Notice: Subject to any disclaimer, the term of this patent is extended or adjusted under 35 U.S.C. 154(b) by 752 days.

(21) Appl. No.: 13/842,889

(22) Filed: Mar. 15, 2013

(51) Int. Cl.
  *H02S 30/20* (2014.01)
  *H01L 31/0525* (2014.01)
  *H02J 1/00* (2006.01)
  *H01L 31/054* (2014.01)

(52) U.S. Cl.
  CPC ........ *H01L 31/045* (2013.01); *H01L 31/0525* (2013.01); *H01L 31/0547* (2014.12); *H02J 1/00* (2013.01); *H02S 30/20* (2014.12)

(58) Field of Classification Search
  CPC ......... H02J 1/00; H02S 30/20; H01L 31/0547
  See application file for complete search history.

(56) References Cited

U.S. PATENT DOCUMENTS

| | | | | |
|---|---|---|---|---|
| 3,510,889 A | * | 5/1970 | Peterson | A47G 9/086 5/413 R |
| 3,584,323 A | * | 6/1971 | Worley | A47G 9/086 2/69.5 |
| 3,965,505 A | * | 6/1976 | Thorowgood | A47G 9/086 5/413 R |
| 4,245,895 A | | 1/1981 | Wildenrotter | |
| 4,316,448 A | * | 2/1982 | Dodge | H01L 31/0547 126/576 |
| 4,833,571 A | | 5/1989 | Granovksy | |
| 5,520,747 A | * | 5/1996 | Marks | B64G 1/222 136/245 |
| 5,522,943 A | * | 6/1996 | Spencer | H01L 31/042 136/245 |

(Continued)

FOREIGN PATENT DOCUMENTS

| | | | | |
|---|---|---|---|---|
| DE | 3919121 A1 | * | 1/1990 | A47G 9/086 |
| DE | 20008441 U1 | * | 7/2000 | H02S 30/20 |

(Continued)

OTHER PUBLICATIONS

Human translation for JP 54057886.*

(Continued)

*Primary Examiner* — Fritz M Fleming (57) ABSTRACT

A solar power system. A plurality of solar cells are joined to a foldable base. The foldable base has areas between the solar cells configured to fold to enable stacking of the solar cells. A voltage regulator is coupled to solar cells and an electrical connector is electrically coupled to the voltage regulator and configured to electrically couple to, and deliver an electric current to, an electrical device. In implementations a reflector is coupled to the foldable base adjacent to one or more of the plurality of solar cells, the reflector including a reflective material on a face of a flexible material, the reflective material configured to reflect light towards one or more of the plurality of solar cells. In implementations the voltage regulator is a pulse width modulation (PWM) voltage regulator. In implementations a switch coupled to the voltage regulator adjusts the voltage output between two or more levels.

20 Claims, 6 Drawing Sheets

(56) References Cited

U.S. PATENT DOCUMENTS

| | | | |
|---|---|---|---|
| 5,885,367 A * | 3/1999 | Brown ................ | H01L 31/0547 136/245 |
| 6,051,775 A * | 4/2000 | Brown ................ | H01L 31/0547 136/245 |
| 6,118,067 A * | 9/2000 | Lashley .............. | H01L 31/0547 136/245 |
| 6,870,089 B1 * | 3/2005 | Gray .................... | H01L 31/042 136/200 |
| 7,368,656 B2 * | 5/2008 | Boulanger .......... | H01L 31/0547 136/245 |
| D599,286 S | 9/2009 | Horito et al. | |
| D600,000 S | 9/2009 | Horito et al. | |
| D625,251 S | 10/2010 | Workman et al. | |
| D629,746 S | 12/2010 | Workman et al. | |
| 8,080,972 B2 | 12/2011 | Smith | |
| D664,499 S | 7/2012 | Workman et al. | |
| D670,244 S | 11/2012 | Workman et al. | |
| 2004/0187906 A1 * | 9/2004 | Boulanger .......... | H01L 31/0547 136/244 |
| 2004/0204179 A1 * | 10/2004 | Hsu ........................ | H02J 7/355 455/573 |
| 2006/0225781 A1 | 10/2006 | Locher | |
| 2009/0102415 A1 * | 4/2009 | Muchow ................ | F03D 9/002 320/101 |
| 2009/0151071 A1 * | 6/2009 | Martin .................... | A47G 9/086 5/413 R |
| 2009/0310391 A1 * | 12/2009 | Becker-Irvin .......... | B64G 1/425 363/79 |
| 2011/0116254 A1 | 5/2011 | Workman et al. | |
| 2011/0162690 A1 | 7/2011 | Workman et al. | |
| 2011/0290307 A1 | 12/2011 | Workman et al. | |
| 2012/0281392 A1 | 11/2012 | Workman et al. | |
| 2013/0043826 A1 | 2/2013 | Workman et al. | |

FOREIGN PATENT DOCUMENTS

| | | | | |
|---|---|---|---|---|
| GB | 1009154 A | * | 11/1965 | ............... A47G 9/08 |
| JP | 54057886 A | * | 5/1979 | |
| WO | WO 2009037386 A1 | * | 3/2009 | ......... H01L 31/0547 |

OTHER PUBLICATIONS

Machine translation for WO2009/037386A1 obtained from ESPACENET.*
Machine Translation for WO2009/037386A1 obtained from ESPACENET.com Sep. 22, 2016.*
Human translation for JP 54057886 obtained from FLS, Inc. Mar. 2016.*
Nomad 27 Solar Panel product description, published at the www.goalzero.com website at least as early as Mar. 10, 2011, available at http://www.goalzero.com/shop/p/10/Nomad-27-Solar-Panel/3:4/.
Nomad 7 Solar Panel product description, published at the www.goalzero.com website at least as early as Feb. 25, 2011, available at http://www.goalzero.com/shop/p/11/Nomad-7-Solar-Panel/3:4/.
Nomad 13 Solar Panel product description, published at the www.goalzero.com website at least as early as Feb. 25, 2011, available at http://www.goalzero.com/shop/p/12/Nomad-13-Solar-Panel/3:4/.
Guardian 12V Charge Controller product description, published at the www.goalzero.com website at least as early as Mar. 8, 2013, available at http://www.goalzero.com/shop/p/156/Guardian-12V-Charge-Controller/6:5/.
4.7mm Charge Controller product description, published at the www.goalzero.com website at least as early as Jul. 27, 2012.
Nomad 13 Portable Solar Panel User Guide, published at the www.goalzero.com website at least as early as Mar. 8, 2013, available at http://www.goalzero.com/creative/assets/guides/Nomad13.pdf.
8.0mm Charge Controller product description, published at the www.goalzero.com website at least as early as Jul. 27, 2012.
GoalZero Power Anywhere Brochure, published at least as early as Jan. 25, 2012.

* cited by examiner

SOLAR POWER SYSTEM AND RELATED METHODS

BACKGROUND

1. Technical Field

Aspects of this document relate generally to photovoltaic generators. Specific implementations relate to handheld, portable solar power generators.

2. Background Art

Photovoltaic generators generate electrical power by converting electromagnetic radiation (like sunlight) into electricity. Various types of solar cells have been devised that are designed to create a voltage potential when exposed to sunlight. A wide variety of systems have been created to develop electricity using solar energy, including systems of home roofs, parking structures, and systems that power hand held calculators.

SUMMARY

Implementations of solar power systems may include: a plurality of solar cells joined to a foldable base, the foldable base having one or more areas between solar cells configured to fold to enable stacking of the plurality of solar cells; at least one reflector coupled to the foldable base adjacent to one or more of the plurality of solar cells, the reflector including a flexible material having a reflective face, the reflective face configured to reflect light towards one or more of the plurality of solar cells when the reflective face is in a reflective position; a voltage regulator coupled to the plurality of solar cells; and an electrical connector electrically coupled to the voltage regulator and configured to electrically couple to, and deliver an electric current to, an electrical device.

Implementations of solar power systems may include one, all, or any of the following:

The at least one reflector may be configured to be folded and stacked with the plurality of solar cells.

The at least one reflector may further have at least one angle adjuster configured to allow a user to secure the at least one reflector at a plurality of angles relative to the foldable base.

The voltage regulator may include a pulse width modulation (PWM) buck-boost voltage regulator.

The solar power system may further include at least four electrical connectors, each electrical connector having a different size. The at least four electrical connectors may be configured to couple to a plurality of electrical devices requiring at least four different operating voltages.

The solar power system may further include a switch coupled to the voltage regulator, the switch configured to allow a user to manually switch between at least two or more output voltages.

The solar power system may further include a second foldable base having a plurality of solar cells joined thereto, an electrical coupler configured to couple the plurality of solar cells of the foldable base with the plurality of solar cells of the second foldable base, and a coupler configured to physically join the foldable base to the second foldable base.

Implementations of solar power systems may include: a plurality of solar cells joined to a foldable base, the foldable base having one or more areas between solar cells configured to fold to enable stacking of the plurality of solar cells; a pulse width modulation (PWM) voltage regulator attached to the foldable base and electrically coupled to the plurality of solar cells; a switch coupled to the PWM voltage regulator configured to adjust a voltage output of the PWM voltage regulator between two or more voltage output levels; and an electrical connector electrically coupled to the PWM voltage regulator and configured to electrically couple to, and deliver an electric current to, an electrical device.

Implementations of solar power systems may include one, all, or any of the following:

The PWM voltage regulator may be configured to be adjustable between at least four different voltage output levels.

The solar power system may further include at least one reflector coupled to the foldable base adjacent to one or more of the plurality of solar cells, the reflector including a flexible material having a reflective face, the reflective face configured to reflect light towards one or more of the plurality of solar cells when the reflective face is in a reflective position.

The PWM voltage regulator may include a buck-boost voltage regulator.

The solar power system may further include at least four electrical connectors, each electrical connector having a different size. The at least four electrical connectors may be configured to couple to a plurality of electrical devices requiring at least four different operating voltages.

The switch may be configured to adjust the voltage output of the PWM voltage regulator between at least four voltage output levels.

The solar power system may further include a second foldable base having a plurality of solar cells joined thereto and an electrical coupler configured to couple the plurality of solar cells of the foldable base with the plurality of solar cells of the second foldable base.

The solar power system may further include a second foldable base having a plurality of solar cells joined thereto and a coupler configured to align and join a longest length of the foldable base with a longest length of the second foldable base.

Implementations of solar power systems may include: a first foldable base having a plurality of solar cells joined thereto, the first foldable base having one or more areas between solar cells configured to fold to enable stacking of the plurality of solar cells; a second foldable base having a plurality of solar cells joined thereto, the second foldable base having one or more areas between solar cells configured to fold to enable stacking of the plurality of solar cells; an electrical coupler configured to electrically couple the plurality of solar cells of the first foldable base with the plurality of solar cells of the second foldable base; a coupler configured to align and join a longest length of the first foldable base with a longest length of the second foldable base; a pulse width modulation (PWM) voltage regulator coupled to the plurality of solar cells of the first foldable base and the plurality of solar cells of the second foldable base; a switch coupled to the PWM voltage regulator and configured to allow a user to manually switch between at least two or more output voltages; and a plurality of electrical connectors of various sizes, each electrical connector configured to electrically couple to the PWM voltage regulator and to an electrical device to deliver an electric current to the electrical device.

Implementations of solar power systems may include one, all, or any of the following:

The coupler may include a zipper.

The solar power system may further include a third foldable base having a plurality of solar cells joined thereto, a second electrical coupler configured to electrically couple the plurality of solar cells of the third foldable base with the plurality of solar cells of one of the first foldable base and the second foldable base, and a second coupler configured to align and join a longest length of the third foldable base with a longest length of one of the first foldable base and the second foldable base, wherein the third foldable base has one or more areas between solar cells configured to fold to enable stacking of the plurality of solar cells of the third foldable base.

The solar power system may further include at least one reflector coupled to at least one of the first foldable base and the second foldable base adjacent to one or more of the plurality of solar cells, the reflector including a flexible material having a reflective face, the reflective face configured to reflect light towards one or more of the plurality of solar cells when the reflective face material is in a reflective position.

The PWM voltage regulator may include a buck-boost voltage regulator.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended solar power systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such solar power systems and related methods, and implementing components and methods, consistent with the intended operation and methods.

Figure 1:
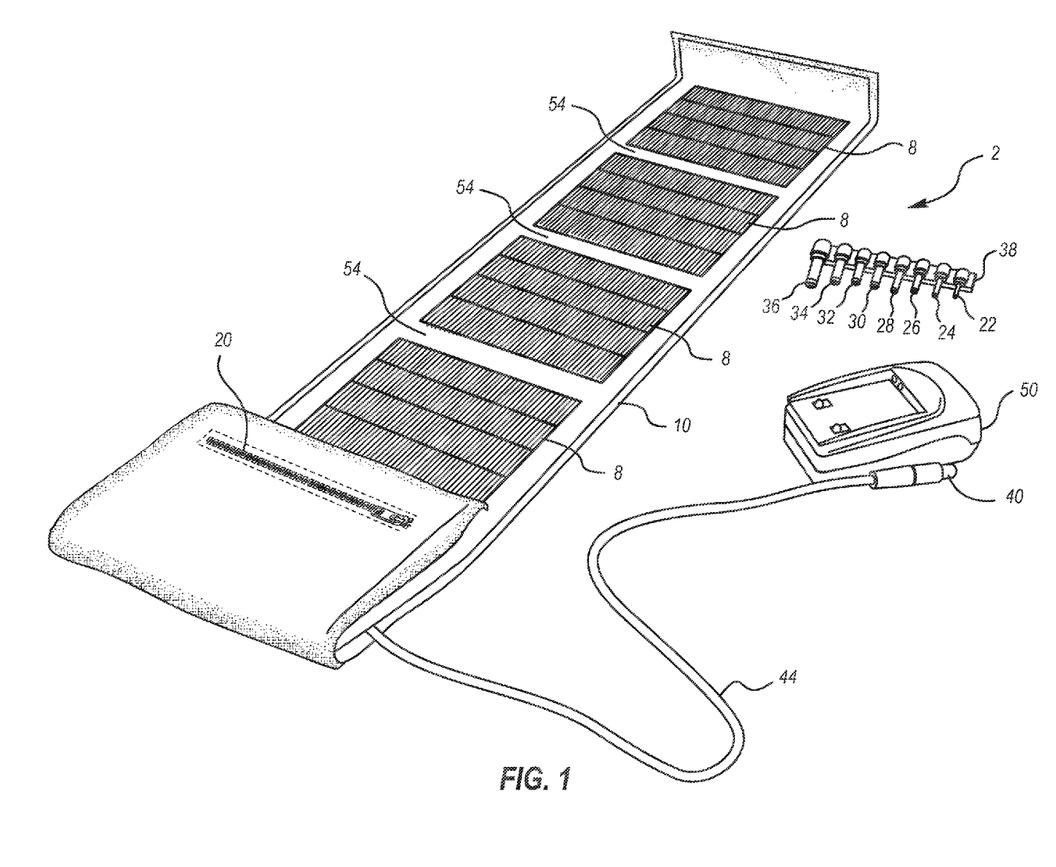
FIG. 1 is a top perspective view of an implementation of a solar power system in an unfolded configuration.
Figure 2:
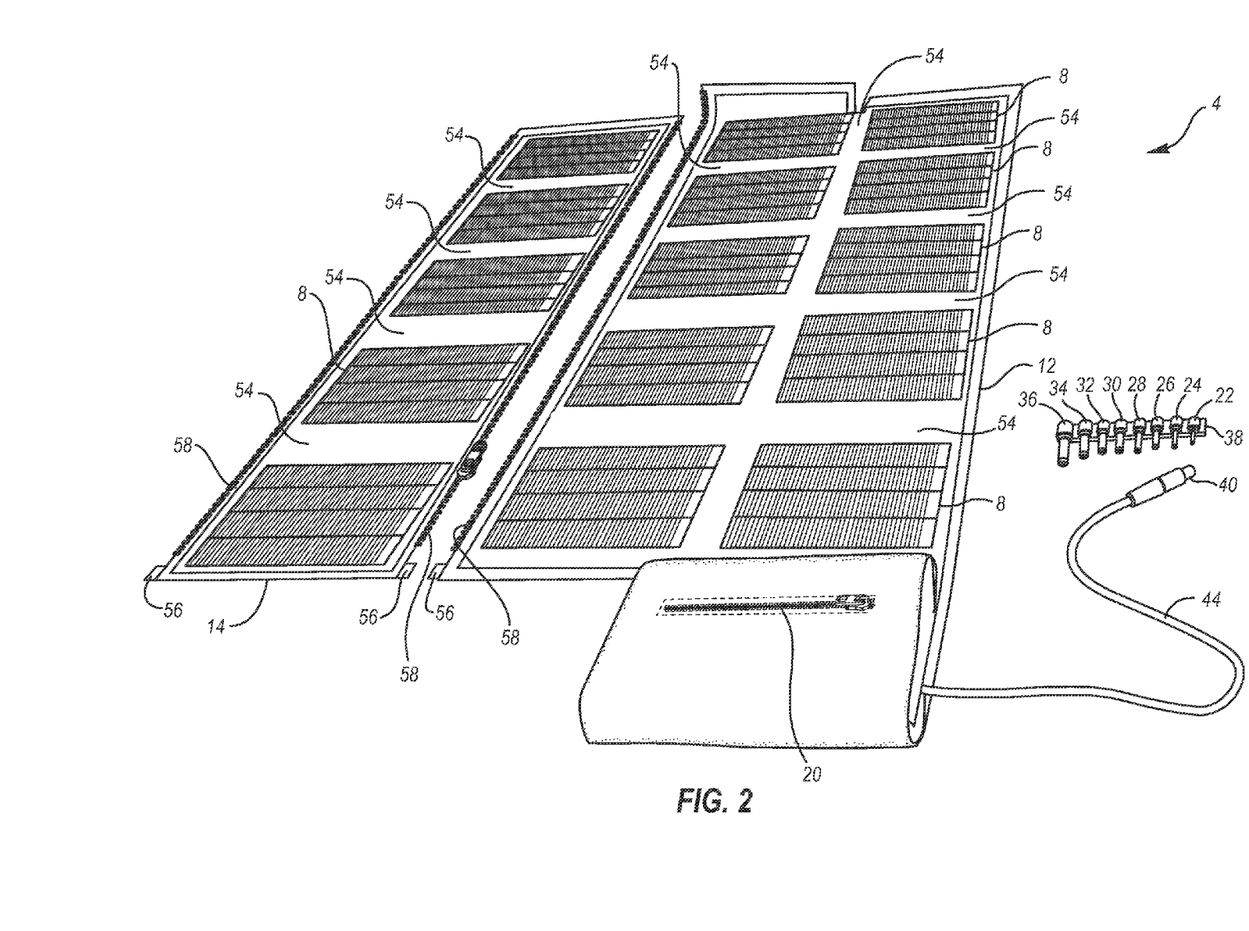
FIG. 2 is a top perspective view of an implementation of a solar power system in an unfolded configuration.
Figure 3:
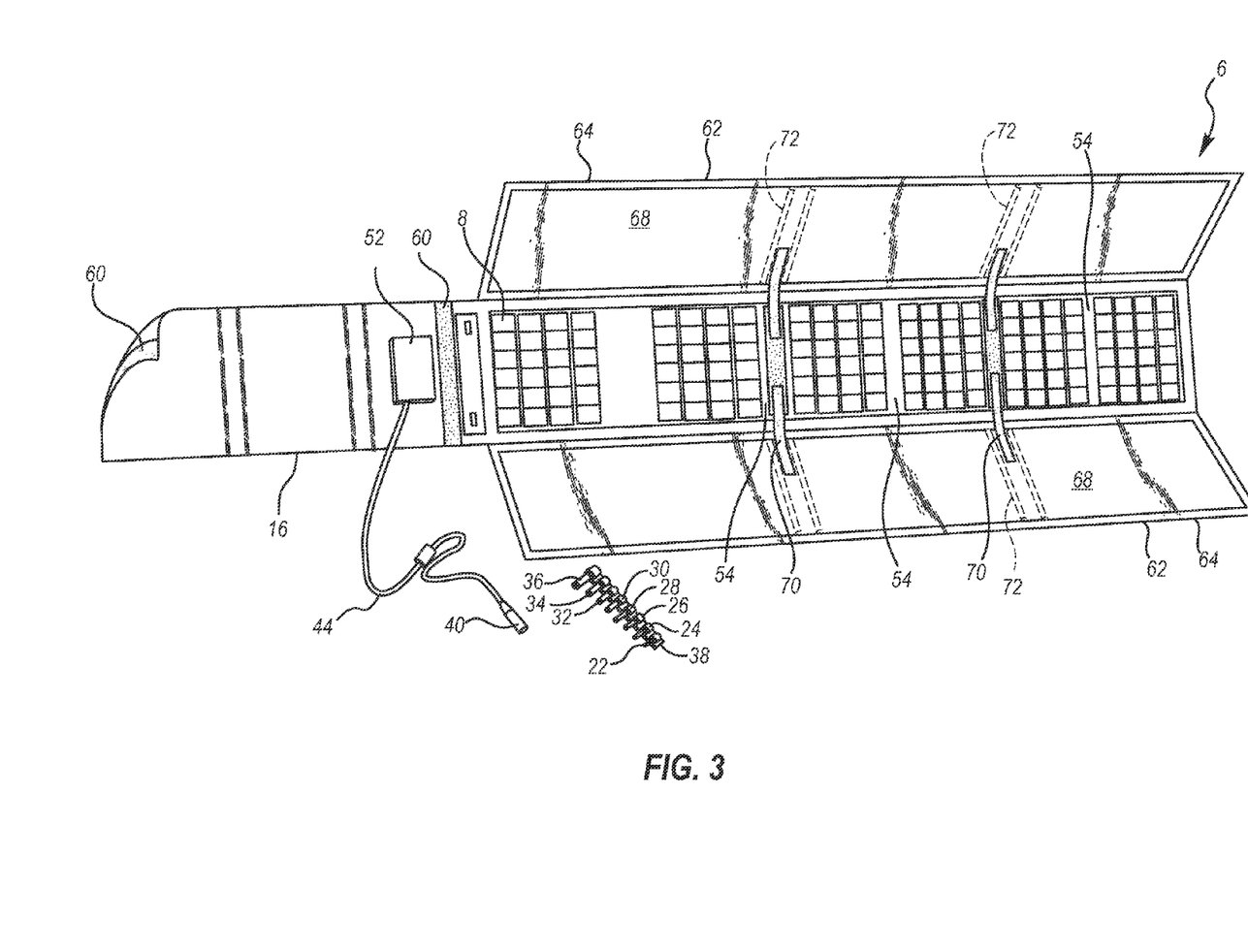
FIG. 3 is a top perspective view of an implementation of a solar power system in an unfolded configuration.

Referring to FIGS. 1-5, various representative solar power systems are disclosed. A solar power system 2, shown in FIGS. 1 and 4-5, includes a foldable base 10 with several solar cells 8 joined thereto. The foldable base 10 in the implementations shown has one column and four rows of solar cells 8. A solar power system 4, shown in FIG. 2, is similar to the solar power system 2 and includes two columns and five rows of solar cells 8 joined to a foldable base 12. Additionally, the solar power system 4 includes an additional foldable base 14, with one column and five rows of solar cells 8 joined thereto, that may be physically coupled to the foldable base 12 and electrically coupled to one or more components on (or coupled to) the foldable base 12. A solar power system 6, shown in FIG. 3, is similar to the solar power system 2 and includes one column and six rows of solar cells 8 on a foldable base 16. The solar power system 6 further includes reflectors 62 that are coupled to the foldable base 16 and that are configured to direct light towards one or more or all of the solar cells 8 of the foldable base 16. Naturally, several of these elements of the solar power systems 2/4/6 may be interchanged with one another (for example the reflectors 62 could be used together with the solar power system 4, and so forth). Additionally, any specific number of row or column configuration of solar cells 8 shown in the drawings or described herein is for representative purposes only, as any number of solar cells 8 could be used more or less than what is shown or described, and as the number of columns and/or number of rows likewise may be more or less than what is represented in the drawings or described herein.

Figure 4:
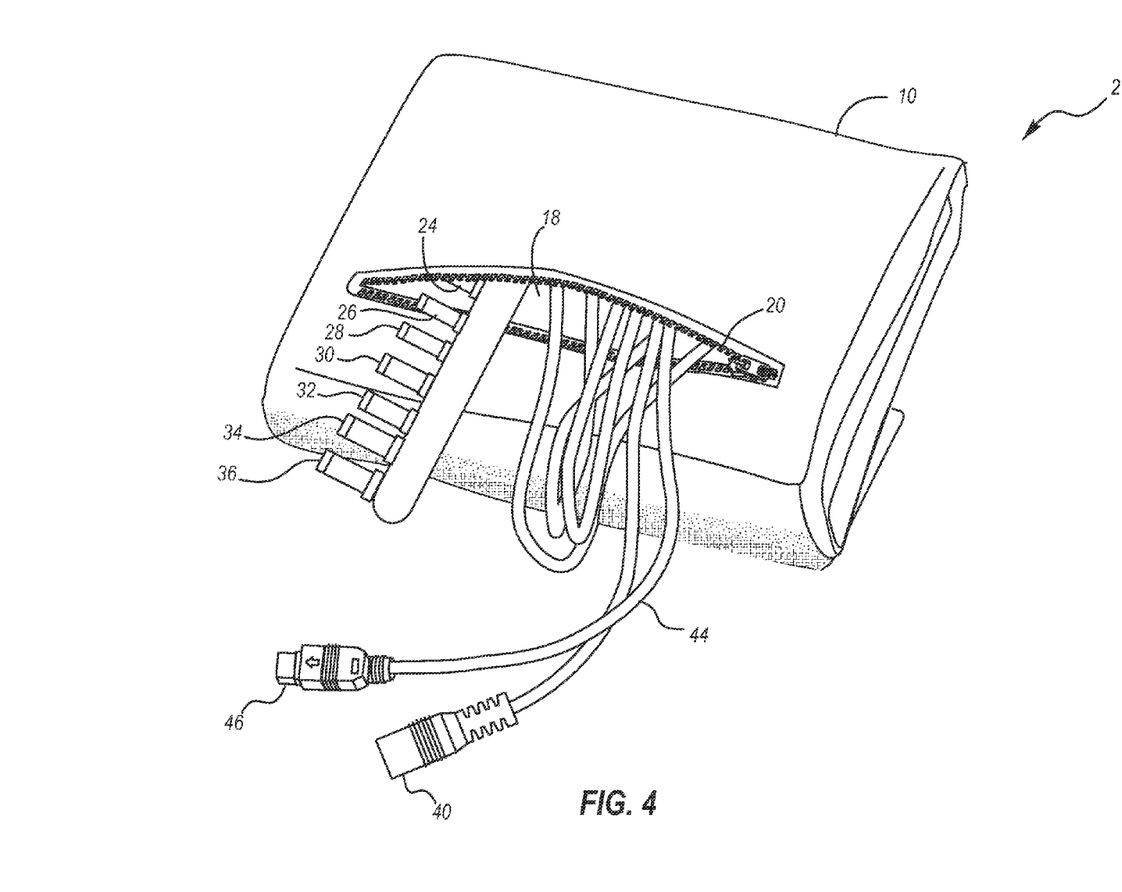
FIG. 4 is a bottom perspective view of an implementation of a solar power system in a folded configuration.

Referring now to FIGS. 1-5, in implementations a solar power system 2/4/6 includes a foldable base 10/12/14/16. A plurality of solar cells 8 are joined to the foldable base 10/12/14/16. In between the solar cells 8 are areas 54 of the foldable base 10/12/14/16 that are foldable. When the areas 54 are folded the foldable base 10/12/14/16 is able to fold in a manner such that the solar cells 8 stack atop one another, in a columnar fashion. The solar power system 2/4/6 is thus able to fold into an easily carryable configuration, as shown in FIG. 4.

In implementations the areas 54 that are foldable may be the only parts of a foldable base 10/12/14/16 that are foldable. In implementations the entire foldable base 10/12/14/16, or substantially all of the foldable base 10/12/14/16 is foldable. In implementations the solar cells 8 may be rigid, while in other implementations the solar cells 8 may be flexible. In implementations the widths of the areas 54 may increase farther from the end of the foldable base 10/12/14/16 that has the voltage regulator 52 when unfolded. For instance, in implementations the first area 54, farthest from the voltage regulator 52, may be about 0.875 inches, the next about 1.25 inches, the next about 1.625 inches, the next about 2.0 inches, and the next about 2.375 inches (this is for a foldable base 10/12/14/16 that has six rows of solar cells 8 and, accordingly, five areas 54 in between the six rows). This may accommodate the increase in bulkiness as the solar cells 8 are stacked during folding.

The solar power system 2/4/6 includes a voltage regulator 52 (shown in FIGS. 3 and 5) that is electrically coupled to the plurality of solar cells 8. The voltage regulator 52 in implementations is attached to the foldable base 10/12/4/16. This attachment may be by any method or mechanism including, by non-limiting example: glue, a friction fit, sewing, hook and loop fasteners, a fastener, a pocket, and the like.

In some implementations the voltage regulator 52 maintains a constant voltage output level. In other implementations the voltage regulator 52 is configured to switch the voltage output level between two or more voltage output levels. In particular implementations the voltage regulator 52 is configured to switch the voltage output level between at least four voltage output levels. In other implementations the voltage regulator 52 is configured to switch the voltage output level between five or more voltage output levels. The voltage regulator 52 in implementations may include any mechanism, method, and mechanical elements or configuration to regulate the voltage in any manner. In particular implementations the voltage regulator 52 includes a pulse width modulation (PWM) voltage regulator 52. In other implementations the voltage regulator 52 may be something other than a PWM voltage regulator 52. In implementations utilizing PWM, the voltage regulator 52 includes a buck-boost converter so that the voltage output level maybe either greater than or less than a voltage input level. In other implementations the voltage regulator 52 may include only a buck converter, or only a boost converter. In various implementations the voltage regulator 52 utilizes pulse width modulation (PWM) and includes a buck-boost converter and is a PWM buck-boost voltage regulator 52.

Figure 5:
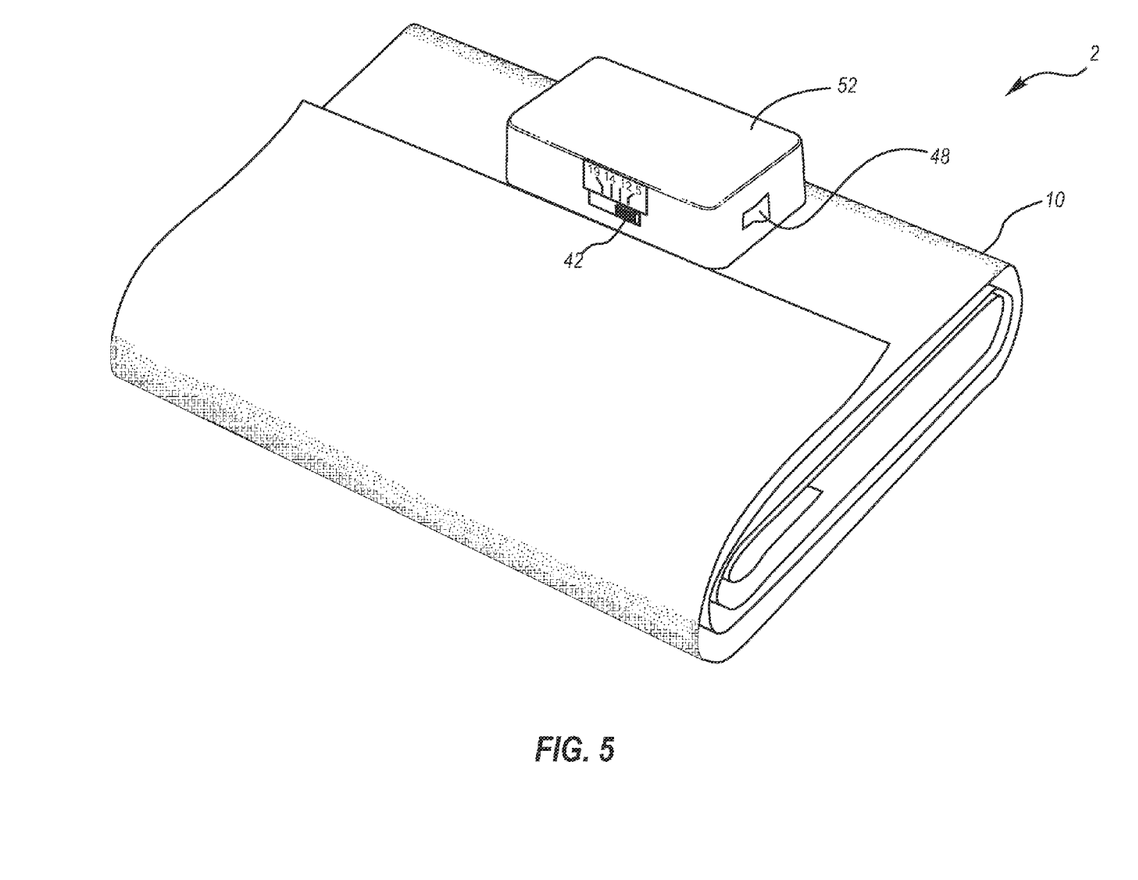
FIG. 5 is a top perspective view of an implementation of a solar power system in a folded configuration.

In implementations a switch 42 is coupled to the voltage regulator 52 and allows a user to manually switch the voltage output level between one of a number of selectable voltage output levels. In FIG. 5 the switch 42 is shown as selectable between voltage output levels of 5V, 12V, 14V and 19V. In other implementations the switch 42 may allow selection between different, or additional, or fewer, voltage output levels. In implementations the switch 42 could be selectable between one, more, or all of the following voltage output levels: 1.5V, 3V, 4.5V, 5V, 6V, 7.5V, 9V, 10.5V, 12V, 13.5V, 14V, 14.2V, 15V, 16.5V, 18V, 19V, 24V and 28V. In other implementations the switch 42 is selectable between voltage output levels of 5V, 12V, 14V, 19V and 24V. In various implementations the switch 42 is selectable between voltage output levels of 5V, 12V, 14V, 19V and 28V. In some implementations the switch 42 is selectable between voltage output levels of 5V, 12V, 14V, 19V, 24V and 28V. In implementations the switch 42 will have the following amount of outputs to select from: two, three, four, five, and six. In implementations the switch 42 may have a rotary, as opposed to a linear, switching architecture.

Referring to FIGS. 1-4, in implementations a solar power system 2/4/6 includes one or more electrical connectors 22-36. In implementations a solar power system 2/4/6 includes a plurality of electrical connectors 22-36. In implementations the plurality of electrical connectors 22-36 are each configured to electrically couple to a specific type of electrical interface of an electrical device. By non-limiting example, in implementations the electrical connectors 22-36 are all coaxial power connectors (by non-limiting example, barrel connectors, concentric barrel connectors or tip connectors) each having a different size. The sizes may include, by non-limiting example, one or more or all of the following sizes, in any combination: an outer diameter (OD) of about 2 mm, 2.35 mm, 2.4 mm, 3 mm, 3.2 mm, 3.4 mm, 3.5 mm, 3.6 mm, 3.8 mm, 4 mm, 4.75 mm, 5 mm, 5.5 mm, 6 mm, 6.3 mm, 6.5 mm, 6.9 mm, 7 mm, or the like; an inner diameter (ID) (where applicable) of about 0.6 mm, 0.7 mm, 0.8 mm, 0.9 mm, 1 mm, 1.1 mm, 1.15 mm, 1.3 mm, 1.35 mm, 1.4 mm, 1.5 mm, 1.7 mm, 1.98 mm, 2.0 mm, 2.1 mm, 2.5 mm, 2.8 mm, 3.0 mm, 3.1 mm, 3.3 mm, 3.4 mm, 3.8 mm, 4.1 mm, 4.2 mm, 4.3 mm, or the like; a center pin diameter (CPD) (where applicable) of about 0.7 mm, 1 mm, 1.4 mm, 1.8 mm, or the like; and a barrel length of about 2.5 mm, 9.0 mm, 9.5 mm, or the like.

Those of ordinary skill in the art will appreciate that any of a wide number of possible electrical connectors could be employed with implementations of solar power systems disclosed herein. In some implementations there are eight electrical connectors 22-36, though in other implementations there could be more or less of the electrical connectors 22-36 included. In other implementations one or more or all of the electrical connectors 22-36 could be something other than a coaxial power connector such as, by non-limiting example (trade names under which each are marketed being indicated in capital letters): a snap and lock DC power connector; a MOLEX connector; an IEC 60906-3:1994 connector; a TAMIYA connector; a DEANS connector; a JST RCY connector; an inverter tabs/lugs connector; an EMPOWER connector; an ANDERSON POWERPOLE connector; an SAE connector; a cigarette lighter socket/receptacle connector; an ISO 4165 connector; an XLR connector; a MOLEX MINI-FIT SR connector; a MOLEX MINI-FIT JR. connector; a MOLEX MICROFIT connector; a MOLEX SABRE connector; an AMP DUAC connector; a DC plug; a Type A UNIVERSAL SERIAL BUS (USB) connector; a Type B USB connector; a Type A mini-USB connector; a Type B mini-USB connector; a Type A micro-USB connector; a Type B micro-USB connector; a POWER PACK connector; a T-configuration CLIPSAL 402/32 socket connector; a banana connector; a blade connector; a ring and spade terminal connector; and the like. In some implementations the electrical connectors 22-36 may be ANSI standard output ports.

In implementations a holder 38 is included in the solar power system 2/4/6. The holder 38 in implementations is configured to receive and store one or more or all of the electrical connectors 22-36 when not in use (or, in implementations, one or more or all of the electrical connectors 22-36 may be used while still connected to, or stored in or on, the holder 38).

Referring to FIGS. 1 and 3-5, in implementations a solar power system 2/4/6 has a cord 44 with a plug 46 at a first distal end, configured to electrically couple to a receiver 48 of the voltage regulator 52, and an interface 40 at a second distal end configured to electrically couple to one or more of the electrical connectors 22-36. In implementations the cord 44 may be omitted and one or more of the electrical connectors 22-36 may electrically couple directly to the voltage regulator 52. In implementations wherein a cord 44 is included the plug 46 may include any type of connector and the interface 40 likewise may include any type of connector. In implementations the plug 46 may be a Type A or Type B USB, Type A or Type B mini-USB or Type A or Type B micro-USB connector or any of the other connectors described herein and/or the receiver 48 may include a Type A or Type B USB, mini-USB or micro-USB connector or any of the other connectors described herein. In various implementations the receiver 48 is a DC cable port.

Referring to FIGS. 1, 2 and 4, in implementations a solar power system 2/4/6 includes a closable pocket 18 incorporated into or otherwise coupled to the foldable base 10/12/14/16, the closable pocket 18 closable with a closure 20. The closable pocket 18 may be used to store, by non-limiting example, one or more or all of the electrical connectors 22-36, the holder 38, and/or the cord 44 when those elements are not in use. It may also be used to store any electrical coupler 56 if the electrical coupler 56 is detachable from the foldable base 10/12/14/16. The closure 20 in various implementations includes a zipper, though in implementations it could include some other mechanism such as, by non-limiting example, a magnet, a hook-and-loop fastener, snap buttons, and the like.

Referring to FIG. 1, in implementations the solar power system 2/4/6 includes a charger 50, configured to receive the interface 40 and configured to charge or power a battery, such as a battery of a cell phone, a battery of a laptop or other electrical device, a rechargeable battery pack, and the like. In particular implementations the solar power system 2/4/6 is current controlled such that the charger 50 itself includes no current control but only provides an interface for the battery to couple properly to the solar power system 2/4/6 for charging.

Referring to FIG. 2, in various implementations a solar power system 4 includes a foldable base 12 that has multiple columns of solar cells 8. By non-limiting example, in the implementation of a solar power system 2 of FIG. 1 there is a single column and four (visible) solar cells 8. The solar power system 4 of FIG. 2 includes two columns and five rows of solar cells 8. In implementations the areas 54 of the foldable base 12 that are capable of being folded include not only areas between rows of solar cells 8 but also areas between columns of solar cells 8, such that the columns may be folded upon one another, and then the rows folded upon one another, and/or vice-versa, to allow the solar power system 4 to store in a compact space similar to the solar power system 2 shown in FIGS. 4-5.

In implementations a solar power system 4 further includes a foldable base 14 that has an additional column and five rows of solar cells 8 therein. The foldable base 14 similarly has areas 54 between the solar cells 8 that are foldable to allow the solar cells 8 to be stacked. Electrical couplers 56 are included on both sides of a distal end of the foldable base 14, and one electrical coupler 56 is included on one side of a distal end of the foldable base 12. These may allow the solar cells 8 of the foldable base 14 to be electrically coupled to the solar cells 8 of the foldable base 12 and/or to the voltage regulator 52. In implementations the electrical couplers 56 may be included in more or fewer locations, or different locations, on or along the length of the foldable base 14 and/or the foldable base 12 and/or there may be greater or fewer numbers of electrical couplers 56. For example the electrical couplers 56 could be placed anywhere along the perimeter of either or both of the foldable base 12 and foldable base 14, and/or any of the electrical couplers 56 could include cords, and the like. In implementations the electrical couplers 56 could include any type of coupler, such as those disclosed herein with respect to the electrical connector 22-36 or any other type of connector. In particular implementations the electrical coupler 56 includes a polarized sealed interconnect.

In implementations the foldable base 12 includes a coupler 58 and/or the foldable base 14 includes a coupler 58 so that the foldable base 12 and foldable base 14 may be physically coupled together. In implementations the foldable bases 12 and 14 are couplable together in a manner that the rows of solar cells 8 are generally aligned. By non-limiting example, in implementations the foldable base 12 and foldable base 14 may be joined along substantially the entire length of a longest length of each in order to physically couple the two together (though a shortest side could also be used). In implementations the coupler 58 is a zipper, though in implementations it could also or alternatively include, by non-limiting example: a re-stickable adhesive, a magnet, a hook-and-loop fastener, clips or buttons, and the like. In the implementation shown the foldable base 12 only has a coupler 58 along one side, though in other implementations the foldable base 12 could have a coupler 58 along two opposing sides, such that a foldable base 14 could be coupled to either side (or two foldable bases 14 could be coupled to the foldable base 12, one on each side). In implementations the foldable base 12 could have couplers 58 along the top or bottom (or both) sides, as opposed to, or in addition to, having a coupler 58 along the left or right side. In such implementations the columns, and not the rows, of solar cells 8 would be aligned when the foldable base 14 is coupled to the foldable base 12. In implementations a foldable base 12 could have a coupler 58 along all four sides, or along any three sides.

Similarly, in the implementation shown the foldable base 14 has a coupler 58 along its left side and right side but, in other implementations, the foldable base 14 may have a coupler 58 along any one side, or any two sides, or any three sides, or all four sides. As may be envisioned, multiple foldable bases 14 could be coupled to one another and one of them coupled to the foldable base 12, thus the electrical input to the voltage regulator 52 may be cascaded up or down depending on the number of foldable bases 14 used. Likewise, in implementations a foldable base 12 may be coupled to another foldable base 12 in similar fashion and either or both voltage regulators 52 could be used to divert electricity to an electrical device.

Referring now to FIG. 3, in implementations a foldable base 10/12/14/16 may include fasteners 60 which may be used to maintain the foldable base 10/12/14/16 in a closed, folded configuration. In the implementations shown the fasteners 60 include hook-and-loop fasteners but in other implementations the fasteners 60 may include any other element or mechanism including, by non-limiting example, snap buttons, a zipper, a magnet, a belt and buckle, a tie, and the like. In implementations of a foldable base 10/12/14/16 the fasteners 60 may be omitted. In implementations in which fasteners 60 are used, they may be placed anywhere on a foldable base 10/12/14/16 to facilitate maintaining the foldable base 10/12/14/16 in a closed configuration. In implementations one portion of a fastener 60 (such as a hook or loop portion of a hook-and-loop fastener) may be placed on an bottom (or under) side of a of a foldable base 10/12/14/16 while another portion of the fastener 60 may be placed on a top (or upper) side of the foldable base 10/12/14/16 so that when the foldable base 10/12/14/16 is folded the two portions of the fastener 60 are in close proximity with one another so as to be coupled. By non-limiting example, in implementations of a foldable base 14 having six solar panels a hook portion of a hook-and-loop fastener may be located on a top (or upper) side of a distal end of the column formed by the foldable base 14, while a loop portion of the hook-and-loop fastener may be placed between the second and third solar cells 8 (measured from their closeness to the hook portion) on a bottom (or under) side of the foldable base 14. Similarly, as shown in FIG. 3 in various implementations one portion of a fastener 60 could be placed on the very distal end of the column formed by a foldable base 10/12/16 on the under or bottom side, while the other portion of the fastener 60 may be placed on the upper or top side of the foldable base 10/12/16 just on the other side of the voltage regulator 52. This results in a configuration wherein the voltage regulator 52 is not covered in the closed configuration (as in FIG. 5). Naturally, the second portion of the fastener 60 could be placed on the other side of the voltage regulator 52 so that the foldable base 10/12/16 wraps over and on top of the voltage regulator 52, therefore covering it, to couple the fastener 60 to a closed configuration.

In various implementations a solar power system 6 includes one or more reflectors 62. In implementations each reflector 62 includes a flexible material 64 having a reflective face 68. The reflective face 68 is configured to reflect light from a light source towards one or more of the solar cells 8 when the reflective face 68 is in a reflective position. The reflecting face 68 may include any of a wide variety of reflective materials, including plastics, rubbers, metals, composites and the like that have the ability to reflect light away from the surface. In implementations the solar power system 6 includes two reflectors 62 on opposing sides of the foldable base 16. In implementations one or more stabilizing members 72 are included in order to render a portion of the reflector 62 rigid, for example in the implementation shown in FIG. 3 several stabilizing members 72, in the form of steel rods, are sewn into pockets in the flexible material 64. In other implementations the stabilizing members 72 may be omitted, or may include some other element, such as a polymer or wooden rod, or some structure, backing, ribbing, and the like, incorporated into the flexible material 64 or coupled thereto. In implementations the stabilizing members 72 are permanently coupled to the flexible material 64. In other implementations the stabilizing members 72 may be removed from the reflector 62. By non-limiting example, in implementations each stabilizing member 72 may each be manually placed by a user in a separate pocket or receiver of the flexible material 64 when in-use, each pocket designed to position the corresponding stabilizing member 72 at a desirable position to stabilize or otherwise properly position the reflective face 68 and, when not in-use, each stabilizing member 72 may be removed and placed elsewhere, for example, in the closable pocket 18. In implementations the stabilizing members 72 are 0.032 inch stainless steel rods that are placed internally in the reflector 62 or the flexible material 64 of the reflector 62.

The reflector 62 in implementations is configured to be folded, along with the foldable base 16. By non-limiting example, in implementations wherein a solar power system 6 includes two reflectors 62, each reflector 62 may be folded down onto the foldable base 16 (the connection between the foldable base 16 and each reflector 62 acting as a hinge), and then the foldable base 16 and reflectors 62 may then be folded together in a manner so as to stack the solar cells 8. In implementations this may be done in a manner to stack each solar cell 8 in a single column of stacked solar cells 8, though in other implementations not shown in the drawings the folding could be done to stack the solar cells 8 in two adjacent columns, and so forth.

The reflector 62 in implementations is permanently coupled to the foldable base 16 such as, by non-limiting example, by sewing the flexible material 64 to the foldable base 16. In other implementations the reflector 62 may be temporarily coupled to the foldable base 16 such as, by non-limiting example, using snap connectors, buttons, a hook-and-loop fastener, a re-stickable adhesive, a magnet, a friction fit, and the like.

In implementations the reflective face 68 is configured to form a parabolic or semi-parabolic shape. In implementations the reflective face 68 naturally forms this shape upon being unfolded without user intervention. In other implementations a user may manually form the reflective face 68 into a parabolic or semi-parabolic shape, such as by pushing lightly on the reflective face 68. In implementations the use of stabilizing members 72 may assist in the formation, with or without user intervention, of the parabolic or semi-parabolic shape. In implementations the parabolic or semi-parabolic shape may assist the reflective face 68 in directing light towards one or more of the solar cells 8.

In implementations one or more angle adjusters 70 are included to allow a user to position the reflector 62 at a plurality of angles relative to the foldable base 16. In the implementations shown in FIG. 3 the angle adjusters 70 are hook-and-loop fasteners, each loop portion being positioned in one of the foldable areas 54 of the foldable base 16 and the distal end of each hook portion sewed onto the flexible material 64. Thus the other distal end of each hook portion may be removed from the loop portion and re-positioned to adjust the angle of the reflector 62 (and, correspondingly, the reflective face 68) relative to the foldable base 16. Although hook-and-loop fasteners may be used, in other implementations the angle adjusters 70 may include, by non-limiting example, a magnet, a friction fit, snaps or buttons, a re-stickable adhesive, and the like.

In implementations the reflector 62 includes silver BoPET (biaxially-oriented polyethylene terephthalate, or MYLAR) laminated ripstop nylon with polyurethane backed 600+ denier polyester backing. In implementations the reflector 62 is configured to amplify the amount of light that reaches one or more of the solar cells 8. In implementations the reflector 62 may be useful during variance in available light energy due to all sun angle attenuation. In implementations the reflector 62 may amplify ambient light available at the solar cells by up to about 300%, depending upon the size and positioning of the reflector 62.

In implementations in which a reflector 62 is used with a foldable base 10/12/14/16 (or combination thereof) that includes two or more columns of solar cells 8, the stabilizing members 72 may include a telescoping stabilizing member 72 that telescopes either within or adjacent to the reflector 62 (such as to use a larger reflector 62 than is shown) and/or within or adjacent to the foldable base 10/12/14/16 to provide support for the reflector 62 and/or, in either case, to allow the stabilizing members 72 to be contracted back to a smaller configuration from their telescoped configuration to achieve proper folding.

Figure 6:
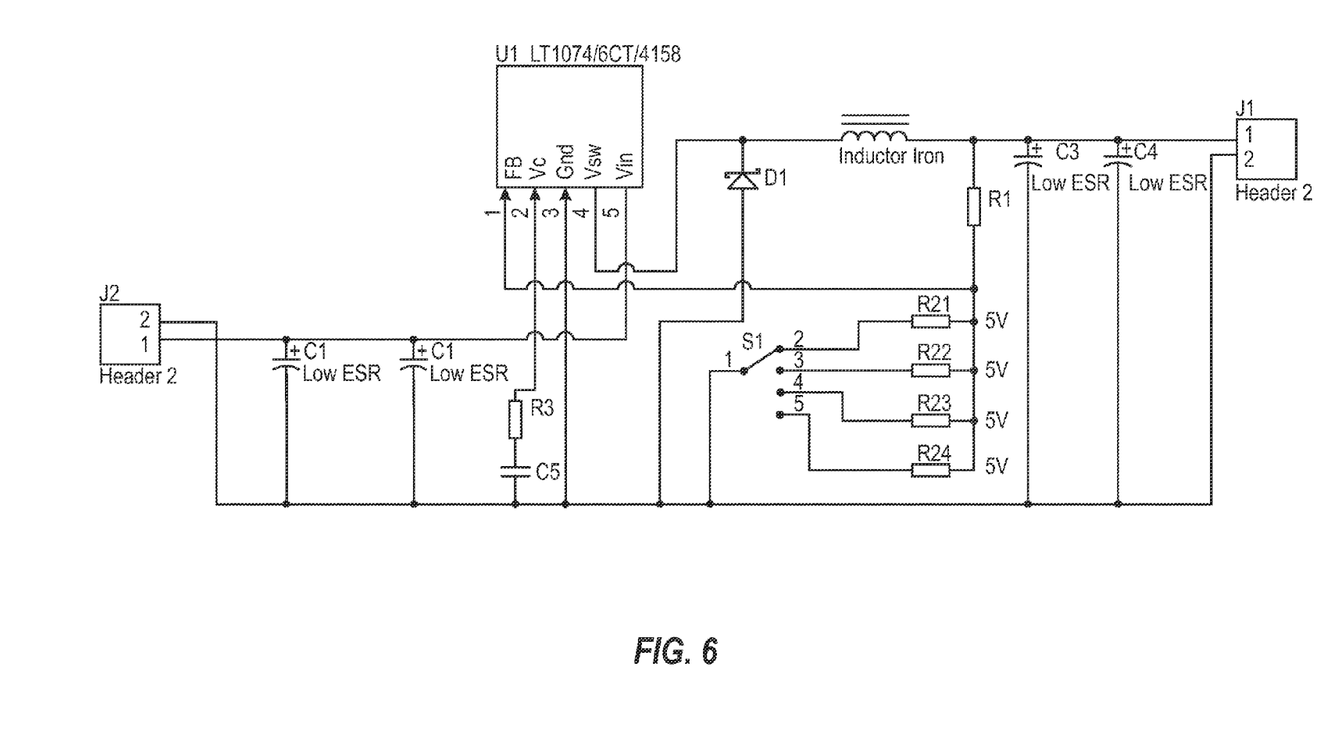
FIG. 6 is a circuit diagram of a pulse width modulation (PWM) voltage regulator of an implementation of a solar power system.

FIG. 6 is a circuit diagram of an implementation of a PWM voltage regulator 52 of a solar power system 2/4/6. Although various magnitudes may be given in the diagram or described herein (such as for values of resistance, voltage, inductance, capacitance, and so forth), and although a specific layout is given for various elements (such as for capacitors, resistors, inductors, diodes, switches, and the like), and although some elements are given by manufacturer and model number, in implementations other magnitudes could be used, other specific layouts could be used for various elements and other manufacturers and model numbers could be used for specific elements. In other words, the descriptions herein and in the drawings are meant only to be representative and not limiting examples.

Referring now to FIG. 6, in implementations: R1 has a resistance of about 2.8 k ohms; R21 has a resistance of about 2.0 k ohms; R22 has a resistance of about 619 ohms; R23 has a resistance of about 511 ohms; R24 has a resistance of about 357 ohms; R3 has a resistance of about 2 k ohms; C1, C2, C3 and C4 are low equivalent series resistance (ESR) capacitors; C5 is a 0.1 microfarad (g) capacitor; S1 is an SW SP4T slide switch (switch 42); D1 is an SB340S diode (VISHAY Schottky barrier rectifier); L1 is an about 18 to about 100 Henrys (µH) iron core inductor; J1 and J2 are jumpers; FB is a ferrite bead; Gnd is ground; Vc is positive terminal; Vsw is the switch output voltage, Vin is the supply voltage; and U1 is a LINEAR TECHNOLOGIES LT1074 or a LT1076 or an NJW 4158 step-down switching regulator marketed by New Japanese Radio. In various implementations a LINEAR TECHNOLOGIES LT1076 regulator may be used. In various implementations the LINEAR TECHNOLOGIES devices use 100 kHz switching. In implementations using an NJW 4148, 72 kHz switching may be used. As indicated on the diagram, the switch 42 in the implementation shown connects the node "1" to either the "2", "3", "4" or "5" node. When the switch 42 couples the "1" node to the "2" node the output voltage is 5V, as indicated on the diagram. Similarly, when the switch 42 is switched to the "3", "4", or "5" nodes the resultant output voltages are 12V, 14V and 19V, respectively. In various implementations C1 & C2, C3 & C4 may be combined to one or two low ESR polymer radials to generate power with a total ripple current no less than about 1500 mA. In implementations capacitor drill holes must be about 0.045 inch in diameter and have about 0.12 inch spacing. In implementations capacitor height must be no greater than about 9 mm.

In implementations the solar cells 8 include monocrystalline cells. In implementations the solar cells 8 are laminated to variable thickness. In implementations the solar cells 8 include FR-4 grade printed circuit boards (PCBs). In particular implementations the solar cells 8 include an epoxy sealing or cover layer. In implementations the solar cells 8 are 1.2 mm FR-4 PCB laminated and epoxy impregnated monocrystalline solar cells (6V at 333 mA, 2 W/Min). In implementations each solar cell 8 may have an active area of about 4 inches by about 4.8125 inches. In implementations each solar cell 8 may have an overall size of about 4 inches by about 5.3125 inches. In implementations the solar cells 8 may be coupled to the foldable base 10/12/14/16 using, by non-limiting example, 19 mm high temperature adhesive backed polyester fabric tape. In implementations the solar cells 8 may have a cell area per watt of about 10 square inches, a peripheral area per watt of about 14 square inches, and a weight per watt of about 1.75 ounces. In implementations the solar cells 8 include a 1.6 mm FR-4 PCB.

Any mechanism or method may be used to join the solar cells 8 to the foldable base 10/12/14/16 including, by non-limiting example: a glue, a friction fit, a pocket, a hook and loop fastener, a magnet, and the like. In implementations about 0.25 inch of the solar cell 8 is mounted under a seam of the foldable base 10/12/14/16 on two opposing sides, and a hook portion of a hook-and-loop fastener is attached to the bottom of the solar cell 8 (such as with glue or any other mechanism), and a loop portion of a hook-and-loop fastener is coupled to the foldable base 10/12/14/16 (such as with glue, sewing, or any other mechanism), so that the solar cell 8 may be slid under the seams of the foldable base 10/12/14/16 on opposing sides and the solar cell 8 may be pressed down so that the hooks and loops of the hook-and-loop fastener engage to hold the solar cell 8 in place. Naturally, the solar cell 8 may be later pulled up to disengage the hooks and loops of the hook-and-loop fastener to remove the solar cell 8 from the foldable base 10/12/14/16. In implementations the voltage regulator 52 could be coupled to the foldable base 10/12/14/16 in similar manner, though in other implementations the voltage regulator 52 may be permanently coupled to the foldable base 10/12/14/16, such as by glue, sewing, and so forth.

In implementations each solar cell 8 may deliver greater than or equal to about 2 watts (6V at 333 mA minimum). In implementations the solar cells 8 are laminated to 1.2 mm FR-4 PCB and epoxy impregnated for high strength. In implementations the solar cells 8 may be stacked in series parallel configurations as high as 60V and current levels to support 8 amp loads at specified voltage outputs and light levels.

In implementations the foldable base 10/12/14/16 includes about 600 denier polyester with a polyurethane back coating. In implementations the foldable base 10/12/14/16 may have a longest length of about 52 inches.

In implementations a receiver 48 may be customized to a user's preferred configuration during manufacturing and assembly of a solar power system 2/4/6. In implementations the interface 40 may be customized to a user's preferred configuration during manufacturing and assembly of a solar power system 2/4/6.

In implementations the voltage regulator 52 may have a low loss voltage control that results in about 92% efficiency. In implementations the voltage regulator 52 includes a baseplate that is mounted to or otherwise attached to the foldable base 10/12/14/16 and a cover, the cover being removable to allow a user access to components of the voltage regulator 52. In implementations the switch 42 is accessible through an opening in the cover when the cover is installed. Implementations of a voltage regulator 52 will operate in buck mode from 28V to 5V. In implementations a PWM voltage regulator 52 is designed with a feedback divider circuit that allows implementation of custom voltage outputs during final assembly of the PWM voltage regulator 52. In implementations the baseplate, cover, or other enclosure for the voltage regulator 52 may have a profile of about 17 mm high with a 9.2 mm component height.

In implementations a PWM voltage regulator 52 and/or switch 42 includes a 2 A, 45 Vin[max] Bipolar switch. In implementations a PWM voltage regulator 52 and/or switch 42 includes a 6 A, 45 Vin[max] Darlington switch. In implementations a PWM voltage regulator 52 and/or switch 42 includes a 6 A, 65 Vin[max] Darlington switch. In implementations a PWM voltage regulator 52 and/or switch 42 includes an 8 A, 45 Vin[max] MOSFET switch. The first three of the above configurations in implementations may have the same pinout assignments and may be heat sinked to the PCB material. The fourth listed configuration in implementations will have an inverse pinout and will have an external heat sink. By non-limiting example, in implementations the fourth listed configuration will be heat sinked to an extruded aluminum enclosure housing. In implementations other metals or materials could be used. In implementations the first three configurations may use high temperature composite enclosures and/or a polymer (such as ABS) enclosure for the PWM voltage regulator 52. In implementations the above first three configurations may operate at an about 92% efficiency level. In implementations the above fourth configuration may operate at an about 98% efficiency level, and may pull about 40 milliohms at various loads and at about a 50% duty cycle.

In implementations a PWM voltage regulator 52 allows multiple output voltages with a constant input current. In implementations a PWM voltage regulator 52 allows an about 88%-92% efficiency of a solar power system 2/4/6.

In implementations the voltage regulator 52 may be an 88%-92% efficient system having a five pin on the board configuration and having one or more of the following configurations: a low voltage low current system; a high current system; a high current high voltage system; a 45 Vin system; and a 65 Vin and 7 amp system. In implementations the voltage regulator 52 may be an about 98% efficient system having a four pin configuration wherein pins are flipped onto an aluminum housing used as a heat sink, and having the following configuration: a 40 Vin and 8 amp system.

In implementations a voltage regulator 52 may have a top voltage of 14.2V to avoid overcharging of car batteries. In implementations the voltage regulator 52 may incorporate a toroidal architecture. In implementations there may be a 2.5V difference between the input voltage to the voltage regulator 52 and the output voltage. In implementations the input voltage to the voltage regulator 52 may be one of the following values: 19V, 24V-60V.

In various implementations the voltage regulator 52 includes a PWM controller. In particular implementations a PWM voltage regulator 52 includes a PWM controller.

In implementations the solar power system 2/4/6 may output one of the following currents: 2 Å, 5 Å, 5.5 Å, 7.5 Å.

In implementations the coupler 58 may include two or more elements to couple one or more foldable bases 10/12/14/16 together. By non-limiting example, in implementations a zipper may be provided to couple most of a longest length, but not the very ends, of one foldable base 10/12/14/16 to most of the longest length of another foldable base 10/12/14/16, while hook-and-loop fasteners may be used to couple the very ends (or a location near the very ends) of the longest lengths together. Naturally, something other than hook-and-loop fasteners could be used, such as snap buttons, magnets, and the like.

In implementations the solar power system 2/4/6 may have about 6 W, 12 W, 18 W or 24 W actual output power at 12V peak radiance. In implementations the add-on panels (foldable base 14 with solar cells 8) may increase the output power by about 6 W per each foldable base 14 added. In implementations the add-on panels (foldable base 14 with solar cells 8) may increase the output power by about 7.5 W each. In implementations each foldable base 14 with solar cells 8 may increase the output power by about 15 W each. In implementations the total output may be increased up to about 36 W. In implementations the total output may be cascadable up to 150 W.

In implementations the solar power system 2/4/6 may have a 2 amp load capability. In implementations the solar power system 2/4/6 may have a 5 amp load capability. In implementations the solar power system 2/4/6 may have a 7.5 amp load capability. In implementations the solar power system 2/4/6 may have an 8 amp load capability. In implementations the voltage output (or one or more voltage outputs) of a solar power system 2/4/6 may be customized during the assembly process according to a user's preferences. In implementations a solar power system 2/4/6 may have a large voltage swing capability such as, by non-limiting example, about 2.5V to about 50V in buck mode, and similar, though higher, voltage swing capabilities in boost mode.

In implementations a solar power system 2/4/6 may have a gross area of about 198 square inches and an active area of 76 square inches, delivering greater than 7.4 watts, including a closable pocket 18 for the cord 44 and eight electrical connectors 22-36, all of this weighing about 14.9 ounces. In implementations a solar power system 2/4/6 may have a weight of about 2.0 ounces per watt and an active surface area (on one side) of about 10.3 square inches per 27 square inches total.

In implementations a foldable base 10/12/14/16 includes one or more wiring cavities wherein all or substantially all of the wiring is internally kept within the wiring cavity. The wiring kept within the wiring cavity in implementations may include the wiring connecting any of the following: the solar cells 8, the voltage regulator 52, the electrical coupler 56, and the like. In implementations the wiring cavity prevents the wiring from being seen or, in other words, allows all or substantially all of the wiring to remain hidden during use of the solar power system 2/4/6. In implementations all wiring of a solar power system 2/4/6 is concealed between denier layers of the foldable base 10/12/14/16. In implementations the foldable base 10/12/14/16 includes one or more openings, such as by non-limiting example one or more about 0.5 inch button holes in the foldable base 10/12/14/16 (such as in a bottom or top layer, or both), for the internal wires to access the one or more electrical couplers 56, the voltage regulator 52, and the like. In implementations the material from which the foldable base 10/12/14/16 is formed is UV resistant polyurethane backed polyester fabric and industrial level seamed adhesive fabrics are used with an internal insulated discrete wiring network. In implementations a low impedance 204L stainless steel conductive thread may be drawn through the foldable base 10/12/14/16 using a commercial level sewing machine for some or all of the wiring.

In implementations a solar power system 2/4/6 may have precision voltage outputs within about 1% of the target value to allow direct charging of specific batteries without additional external monitor and/or control circuitry.

Implementations of solar power systems 2/4/6 may have one or more of the following configurations: a single column of four solar cells 8 (8 watts) with four voltage levels; a single column of six solar cells 8 (12 watts); two columns of five solar cells 8 each (20 watts); a single column of three to ten solar cells 8 (six to twenty watts); a single column of three to ten solar cells 8 at eight watts; a single column of three to ten solar cells 8 at twelve watts; two columns of six solar cells 8 each (twenty-four watts) with electrical couplers 56 and coupler 58 to accept additional single column, six solar cells 8 (twelve watt) or double columns of six solar cells 8 each (twenty-four watts) to support loads up to eight amps and low sun angles; dual columns of five solar cells 8 each capable of operating in a dual column parallel series mode (20 watts) or a ten cells in series mode (40 watts), and; a custom polarized blade connector tip for one of the electrical connectors 22-36 for direct charging single cell lithium ion batteries at 4.2V and/or double cell lithium ion batteries at 8.4V without the need of an additional charging unit (this may, in implementations, be accomplished with a three solar cell 8 (six watt) or four solar cell 8 (eight watt) configuration).

Implementations of methods of making and/or using a solar power system 2/4/6 may include: component tweaking for power circuits that control a switching duty cycle; using current control circuitry feedback; using current limiting for circuits for direct charging 8.4V and/or 4.2V lithium ion batteries; and the like.

Implementations of use of a solar power system 2/4/6 may include one, all, or any of the following: unfolding a foldable base 10/12/14/16; electrically coupling two or more foldable bases 10/12/14/16 together; physically coupling two or more foldable bases 10/12/14/16 together; physically joining two or more foldable bases 10/12/14/16 together along their longest lengths; removing one of a cord 44 and/or one or more electrical connectors 22-36 from a closable pocket 18; coupling the cord 44 to a voltage regulator 52 that is attached to the foldable base 10/12/14/16; selecting one electrical connector 22-36 from a plurality of electrical connectors 22-36 and coupling the selected electrical connector 22-36 to an interface 40 of the cord 44; selecting a voltage level of the voltage regulator 52 from among a plurality of ouput voltages using a switch 42; regulating the voltage output of the solar power system 2/4/6 using a PWM voltage regulator 52; coupling the electrical connector 22-36 to an electrical device or battery for powering or charging the electrical device or battery; decoupling the electrical connector 22-36 from the electrical device or battery; placing the electrical connectors 22-36 and cord 44 in the closable pocket 18; folding the foldable base 10/12/14/16; and securing the foldable base 10/12/14/16 closed using a fastener 60.

In implementations a solar power system 2/4/6 includes a plurality of solar cells 8 joined to a foldable base 10/12/14/16, the foldable base 10/12/14/16 having one or more areas 54 between solar cells 8 configured to fold to enable stacking of the plurality of solar cells 8; at least one reflector 62 coupled to the foldable base 10/12/14/16 adjacent to one or more of the plurality of solar cells 8, the reflector 62 including a flexible material 64 having a reflective face 68, the reflective face 68 configured to reflect light towards one or more of the plurality of solar cells 8 when the reflective face 68 is in a reflective position; a voltage regulator 52 coupled to the plurality of solar cells 8; and an electrical connector 22-36 electrically coupled to the voltage regulator 52 and configured to electrically couple to, and deliver an electric current to, an electrical device. In implementations the at least one reflector 62 is configured to be folded and stacked with the plurality of solar cells 8. In implementations the at least one reflector 62 further includes at least one angle adjuster 70 configured to allow a user to secure the at least one reflector 62 at a plurality of angles relative to the foldable base 10/12/14/16. In implementations the voltage regulator 52 includes a pulse width modulation (PWM) buck-boost voltage regulator 52. In implementations the solar power system 2/4/6 further includes at least four electrical connectors 22-36, each electrical connector 22-36 having a different size, and wherein the at least four electrical connectors 22-36 are configured to couple to a plurality of electrical devices requiring at least four different operating voltages. In implementations a switch 42 is coupled to the voltage regulator 52, the switch 42 configured to allow a user to manually switch between at least two or more output voltages. In implementations the solar power system 2/4/6 includes a second foldable base 10/12/14/16 having a plurality of solar cells 8 joined thereto, an electrical coupler 56 configured to couple the plurality of solar cells 8 of the foldable base 10/12/14/16 with the plurality of solar cells 8 of the second foldable base 10/12/14/16, and a coupler 58 configured to physically join the foldable base 10/12/14/16 to the second foldable base 10/12/14/16.

In implementations a solar power system 2/4/6 includes a plurality of solar cells 8 joined to a foldable base 10/12/14/16, the foldable base 10/12/14/16 having one or more areas 54 between solar cells 8 configured to fold to enable stacking of the plurality of solar cells 8; a pulse width modulation (PWM) voltage regulator 52 attached to the foldable base 10/12/14/16 and electrically coupled to the plurality of solar cells 8; a switch 42 coupled to the PWM voltage regulator 52 configured to adjust a voltage output of the PWM voltage regulator 52 between two or more voltage output levels; and an electrical connector 22-36 electrically coupled to the PWM voltage regulator 52 and configured to electrically couple to, and deliver an electric current to, an electrical device. In implementations the PWM voltage regulator 52 is configured to be adjustable between at least four different voltage output levels. In implementations the solar power system 2/4/6 further includes at least one reflector 62 coupled to the foldable base 10/12/14/16 adjacent to one or more of the plurality of solar cells 8, the reflector 62 including a flexible material 64 having a reflective face 68, the reflective face 68 configured to reflect light towards one or more of the plurality of solar cells 8 when the reflective face 68 is in a reflective position. In implementations the PWM voltage regulator 52 includes a buck-boost voltage regulator 52. In implementations the solar power system 2/4/6 further includes at least four electrical connectors 22-36, each electrical connector 22-36 having a different size, and wherein the at least four electrical connectors 22-36 are configured to couple to a plurality of electrical devices requiring at least four different operating voltages. In implementations the switch 42 is configured to adjust the voltage output of the PWM voltage regulator 52 between at least four voltage output levels. In implementations the solar power system 2/4/6 includes a second foldable base 10/12/14/16 having a plurality of solar cells 8 joined thereto and an electrical coupler 56 configured to couple the plurality of solar cells 8 of the foldable base 10/12/14/16 with the plurality of solar cells 8 of the second foldable base 10/12/14/16. In implementations the solar power system 2/4/6 includes a second foldable base 10/12/14/16 having a plurality of solar cells 8 joined thereto and a coupler 58 configured to align and join a longest length of the foldable base 10/12/14/16 with a longest length of the second foldable base 10/12/14/16.

In implementations a solar power system 2/4/6 includes: a first foldable base 10/12/14/16 having a plurality of solar cells 8 joined thereto, the first foldable base 10/12/14/16 having one or more areas 54 between solar cells 8 configured to fold to enable stacking of the plurality of solar cells 8; a second foldable base 10/12/14/16 having a plurality of solar cells 8 joined thereto, the second foldable base 10/12/14/16 having one or more areas 54 between solar cells 8 configured to fold to enable stacking of the plurality of solar cells 8; an electrical coupler 56 configured to electrically couple the plurality of solar cells 8 of the first foldable base 10/12/14/16 with the plurality of solar cells 8 of the second foldable base 10/12/14/16; a coupler 58 configured to align and join a longest length of the first foldable base 10/12/14/16 with a longest length of the second foldable base 10/12/14/16; a pulse width modulation (PWM) voltage regulator 52 coupled to the plurality of solar cells 8 of the first foldable base 10/12/14/16 and the plurality of solar cells 8 of the second foldable base 10/12/14/16; a switch 42 coupled to the PWM voltage regulator 52 and configured to allow a user to manually switch between at least two or more output voltages; and a plurality of electrical connectors 22-36 of various sizes, each electrical connector 22-36 configured to electrically couple to the PWM voltage regulator 52 and to an electrical device to deliver an electric current to the electrical device. In implementations the coupler 58 includes a zipper. In implementations the solar power system 2/4/6 includes a third foldable base 10/12/14/16 having a plurality of solar cells 8 joined thereto, a second electrical coupler 56 configured to electrically couple the plurality of solar cells 8 of the third foldable base 10/12/14/16 with the plurality of solar cells 8 of one of the first foldable base 10/12/14/16 and the second foldable base 10/12/14/16, and a second coupler 58 configured to align and join a longest length of the third foldable base 10/12/14/16 with a longest length of one of the first foldable base 10/12/14/16 and the second foldable base 10/12/14/16, wherein the third foldable base 10/12/14/16 has one or more areas 54 between solar cells 8 configured to fold to enable stacking of the plurality of solar cells 8 of the third foldable base 10/12/14/16. In implementations the solar power system 2/4/6 includes at least one reflector 62 coupled to at least one of the first foldable base 10/12/14/16 and the second foldable base 10/12/14/16 adjacent to one or more of the plurality of solar cells 8, the reflector 62 including a flexible material 64 having a reflective face 68, the reflective face 68 configured to reflect light towards one or more of the plurality of solar cells 8 when the reflective face 68 is in a reflective position. In implementations the PWM voltage regulator 52 includes a buck-boost voltage regulator 52.

In places where the description above refers to particular implementations of a solar power system and implementing components, sub-components, methods and sub-methods, it should be readily apparent that a number of modifications may be made without departing from the spirit thereof and that these implementations, implementing components, sub-components, methods and sub-methods may be applied to other solar power systems.

What is claimed is:

1. A solar power system, comprising:
a plurality of solar cells joined to a foldable base, the foldable base having one or more areas between solar cells configured to fold to enable stacking of the plurality of solar cells;
at least one reflector coupled to the foldable base adjacent to one or more of the plurality of solar cells, the at least one reflector comprising a flexible material having a continuously flexible reflective face, the continuously flexible reflective face configured to reflect light towards one or more of the plurality of solar cells when the continuously flexible reflective face is in a reflective position;
a voltage regulator coupled to the plurality of solar cells; and
an electrical connector electrically coupled to the voltage regulator and configured to electrically couple to, and deliver an electric current to, an electrical device;
wherein the at least one reflector is configured to fold over the plurality of solar cells along a fold that is parallel with a longest length of the solar power system, and;
wherein when the at least one reflector is folded over the plurality of solar cells the at least one reflector and the plurality of solar cells are configured to be folded together in a roll fold to stack the plurality of solar cells and the at least one reflector.

2. The system of claim 1, wherein the at least one reflector is configured to be folded and stacked with the plurality of solar cells.

3. The system of claim 1, wherein the at least one reflector further comprises at least one angle adjuster configured to allow a user to secure the at least one reflector at a plurality of angles relative to the foldable base.

4. The system of claim 1, wherein the voltage regulator comprises a pulse width modulation (PWM) buck-boost voltage regulator.

5. The system of claim 1, further comprising at least four electrical connectors, each electrical connector having a different size, and wherein the at least four electrical connectors are configured to couple to a plurality of electrical devices requiring at least four different operating voltages.

6. The system of claim 1, further comprising a switch coupled to the voltage regulator, the switch configured to allow a user to manually switch between at least two or more output voltages.

7. The system of claim 1, further comprising a second foldable base having a plurality of solar cells joined thereto, an electrical coupler configured to couple the plurality of solar cells of the foldable base with the plurality of solar cells of the second foldable base, and a coupler configured to physically join the foldable base to the second foldable base.

8. The system of claim 1, wherein the roll fold stacks the plurality of solar cells and the at least one reflector in only a single column.

9. The system of claim 1, wherein the at least one reflector comprises a longest length that is parallel with the longest length of the solar power system.

10. A solar power system, comprising:
a plurality of solar cells joined to a foldable base, the foldable base having one or more areas between solar cells configured to fold to enable stacking of the plurality of solar cells;
a pulse width modulation (PWM) voltage regulator attached to the foldable base and electrically coupled to the plurality of solar cells;
a switch coupled to the PWM voltage regulator configured to adjust a voltage output of the PWM voltage regulator between two or more voltage output levels;
an electrical connector electrically coupled to the PWM voltage regulator and configured to electrically couple to, and deliver an electric current to, an electrical device, and;
at least one reflector coupled to the foldable base adjacent to one or more of the plurality of solar cells, wherein the at least one reflector further comprises at least one angle adjuster configured to allow a user to secure the at least one reflector at a plurality of angles relative to the foldable base;
wherein the at least one reflector comprises a flexible material having a continuously flexible reflective face;
wherein the at least one reflector is configured to fold over the plurality of solar cells along a fold that is parallel with a longest length of the solar power system, and;
wherein when the at least one reflector is folded over the plurality of solar cells the at least one reflector and the plurality of solar cells are configured to be folded together in a roll fold to stack the plurality of solar cells and the at least one reflector.

11. The system of claim 10, wherein the PWM voltage regulator is configured to be adjustable between at least four different voltage output levels.

12. The system of claim 10, wherein the PWM voltage regulator comprises a buck-boost voltage regulator.

13. The system of claim 10, further comprising at least four electrical connectors, each electrical connector having a different size, and wherein the at least four electrical connectors are configured to couple to a plurality of electrical devices requiring at least four different operating voltages.

14. The system of claim 10, wherein the switch is configured to adjust the voltage output of the PWM voltage regulator between at least four voltage output levels.

15. The system of claim 10, further comprising a second foldable base having a plurality of solar cells joined thereto and an electrical coupler configured to couple the plurality of solar cells of the foldable base with the plurality of solar cells of the second foldable base.

16. The system of claim 10, further comprising a second foldable base having a plurality of solar cells joined thereto and a coupler configured to align and join a longest length of the foldable base with a longest length of the second foldable base.

17. A solar power system, comprising:
a first foldable base having a plurality of solar cells joined thereto, the first foldable base having one or more areas between solar cells configured to fold to enable stacking of the plurality of solar cells;
a second foldable base having a plurality of solar cells joined thereto, the second foldable base having one or more areas between solar cells configured to fold to enable stacking of the plurality of solar cells;
an electrical coupler configured to electrically couple the plurality of solar cells of the first foldable base with the plurality of solar cells of the second foldable base;

a coupler configured to align and join a longest length of the first foldable base with a longest length of the second foldable base;

a pulse width modulation (PWM) voltage regulator coupled to the plurality of solar cells of the first foldable base and the plurality of solar cells of the second foldable base;

a switch coupled to the PWM voltage regulator and configured to allow a user to manually switch between at least two or more output voltages; and a plurality of electrical connectors of various sizes, each electrical connector configured to electrically couple to the PWM voltage regulator and to an electrical device to deliver an electric current to the electrical device, and;

at least one reflector coupled to at least one of the first foldable base and the second foldable base adjacent to one or more of the plurality of solar cells, the at least one reflector comprising a flexible material having a continuously flexible reflective face;

wherein the at least one reflector is configured to fold over the plurality of solar cells along a fold that is parallel with a longest length of the solar power system, and;

wherein when the at least one reflector is folded over the plurality of solar cells the at least one reflector and the plurality of solar cells are configured to be folded together in a roll fold to stack the plurality of solar cells and the at least one reflector, and;

wherein the coupler comprises a zipper.

18. The system of claim 17, further comprising a third foldable base having a plurality of solar cells joined thereto, a second electrical coupler configured to electrically couple the plurality of solar cells of the third foldable base with the plurality of solar cells of one of the first foldable base and the second foldable base, and a second coupler configured to align and join a longest length of the third foldable base with a longest length of one of the first foldable base and the second foldable base, wherein the third foldable base has one or more areas between solar cells configured to fold to enable stacking of the plurality of solar cells of the third foldable base.

19. The system of claim 17, further comprising at least one reflector coupled to at least one of the first foldable base and the second foldable base adjacent to one or more of the plurality of solar cells, the at least one reflector comprising a flexible material having a reflective face, the reflective face configured to reflect light towards one or more of the plurality of solar cells when the reflective face is in a reflective position.

20. The system of claim 17, wherein the PWM voltage regulator comprises a buck-boost voltage regulator.

* * * * *